(12) United States Patent
Kochale et al.

(10) Patent No.: US 7,286,598 B2
(45) Date of Patent: Oct. 23, 2007

(54) BIT RECOVERY SCHEME FOR AN ASYMMETRIC DATA CHANNEL

(75) Inventors: Axel Kochale, Springe (DE); Klaus Gaedke, Hannover (DE); Friedrich Timmermann, Garbsen (DE); Oliver Theis, Kalletal (DE)

(73) Assignee: Thomson Licensing, Boulogne (FR)

( * ) Notice: Subject to any disclaimer, the term of this patent is extended or adjusted under 35 U.S.C. 154(b) by 673 days.

(21) Appl. No.: 10/854,732

(22) Filed: May 26, 2004

(65) Prior Publication Data

US 2004/0247026 A1 Dec. 9, 2004

(30) Foreign Application Priority Data

Jun. 6, 2003 (EP) .................... 03012954

(51) Int. Cl.
*H03K 5/159* (2006.01)
(52) U.S. Cl. .................................................. 375/232
(58) Field of Classification Search ........ 375/229–233, 375/290, 355
See application file for complete search history.

(56) References Cited

U.S. PATENT DOCUMENTS

| | | | |
|---|---|---|---|
| 4,468,786 A * | 8/1984 | Davis ..................... | 375/229 |
| 6,449,110 B1 | 9/2002 | DeGroat et al. ........... | 360/46 |
| 7,012,957 B2 * | 3/2006 | Allpress et al. .......... | 375/233 |
| 7,167,516 B1 * | 1/2007 | He ........................ | 375/232 |

| | | | |
|---|---|---|---|
| 2002/0060827 A1 | 5/2002 | Agazzi .................... | 359/161 |

FOREIGN PATENT DOCUMENTS

WO 02/43340 5/2002

OTHER PUBLICATIONS

Srinivasan Gopalaswamy et al., "Decision-Directed Correction for Bloom In Optical Recording Channels" Aug. 9, 1999 2000 Publication Board, Japanese Journal of Applied Physics Part 1 No. 2B Feb. 2000, Jap. Apl. Phys. vol. 39 (2000) pp. 834-836 XP-001051387.
Ko etl al., "A Robust Digital Timing Recovery With Asymmetry Compensator for High Speed Optical Drive Systems" Jul. 16, 2001, PD-20-08-2001 p. 821-830, XP-002237635.
Pozidis et al., "A Simple Nonlinear Model For The Optical Recording Channel", PD 18-06-00, p. 99-103, B0243400, XP-001942920.
Hangyu Cho et al., "Combining Nonlinear Equalization And Simple Detection For High-Density Optical Recording Channels", IEEE Transactions On Magnetics, vol. 38, No. 5, Sep. 2002, PD 00-09-2002, P2313-2315, XP-002237636.

* cited by examiner

*Primary Examiner*—Khanh C. Tran
(74) *Attorney, Agent, or Firm*—Joseph J. Laks; Ronald H. Kurdyla; Joseph J. Opalach

(57) ABSTRACT

A method for bit recovery in an asymmetric data channel, the method comprising the steps of: providing a non-linear equalization filter with two coefficient sets; using the non-linear equalization filter with a first coefficient set for compensating defects of a first type of transition between different storage states; and using the non-linear equalization filter with a second coefficient set for compensating defects of a second type of transition between different storage states.

9 Claims, 4 Drawing Sheets

BIT RECOVERY SCHEME FOR AN ASYMMETRIC DATA CHANNEL

FIELD OF THE INVENTION

The present invention relates to a method and a device for bit recovery in an asymmetric data channel, and to an apparatus for reading from and/or writing to recording media using such method or device.

BACKGROUND OF THE INVENTION

In current harddisk and optical disk applications partial response maximum likelihood detectors (PRML, Viterbi) are used for recovering the data from a channel data stream. FIG. 1 shows high frequency channel data representing a data stream from an exemplary optical channel signal. The channel data are not distorted by asymmetry. In this case a data slicing process is easily able to distinguish between two different signal states (high and low). However, the data patterns recorded on a recording medium may be distorted by an asymmetric data writing procedure. For example, on optical recording media one reason for asymmetry is Blooming, which is caused by non-linear effects during data recording. FIG. 2 shows an example of a channel data stream deteriorated by strong signal asymmetry. Due to the asymmetry a simple slicing algorithm is not able to properly distinguish between data bits representing digital high or low, since adaptive equalization means fail. This problem becomes worse when noise is present. In order to properly recover the channel data from this signal a compensation scheme is needed.

Usually a digitised optical channel data stream is resynchronized to the channel clock using a phase locked loop (PLL) and a sample rate converter (SRC), then equalized with a filter setting representing the inverse channel behaviour and finally detected using a simple slicer and a bit detector.

An adaptive approach using a maximum likelihood decoder calculates the difference of the recovered data to the equalized data, e.g. with the least mean square (LMS) method, and uses this as adjusting information in order to get a coefficient set for the equalizer, which better fits to the channel characteristic. The LMS updating is typically implemented as follows:

$$\text{Coeff}_{new} = \text{Coeff}_{old} + \mu \times \epsilon(\text{filtered vit}_{out}, \text{eq}_{out}) \times \text{channel data}$$

However, some approaches only consider the direction (+ or −) of the error signal $\epsilon$.

It has been found that the cause of signal asymmetry shows different behaviour during a transition from one storage state (e.g. land) to another storage state (e.g. pit). By separately compensating both transition defects a better signal data representation is found for decoding the contained data bits using a maximum likelihood approach. FIG. 3 shows an advanced version of the above scheme, which makes use of this finding by adjusting a separate equalizer for each edge of the incoming data signal.

It is an object of the invention to improve the methods known from prior art.

SUMMARY OF THE INVENTION

According to the invention, a method for bit recovery in an asymmetric data channel comprises the steps of:

providing a non-linear equalization filter with two coefficient sets;
using the non-linear equalization filter with a first coefficient set for compensating defects of a first type of transition between different storage states; and
using the non-linear equalization filter with a second coefficient set for compensating defects of a second type of transition between different storage states.

The invention combines the usage of a non-linear equalization filter with means for compensating both transitions separately. Adopting the separate adaptation processes to a non-linear equalization approach greatly improves the data detection using maximum likelihood decoders.

Favourably, the equalizer scheme is implemented at least twice in parallel. In this way it supports faster channel data streams. Alternatively, it is designed as a single circuit recalculating the new sample by working on different phases of a system clock.

According to a first implementation of the inventive solution, the system clock is faster than twice the channel clock. In this case the two coefficient sets may be switched over. According to a second implementation, the system clock is slower than twice the channel clock. In this case the switching is accomplished on different system clock phases.

Usually the modulation of a channel data stream is subject to certain runlength restrictions. This allows to use a slower system clock, since some calculations are no longer required.

The method or the device are advantageously used in an apparatus for reading from and or writing to optical recording media. However, they can be applied to any other signal detection means dealing with asymmetric signal distortions.

BRIEF DESCRIPTION OF THE DRAWINGS

For a better understanding of the invention, an exemplary embodiment is specified in the following description with reference to the figures. It is understood that the invention is not limited to this exemplary embodiment and that specified features can also expediently be combined and/or modified without departing from the scope of the present invention. In the figures.

DETAILED DESCRIPTION OF PREFERRED EMBODIMENTS

Figure 1:
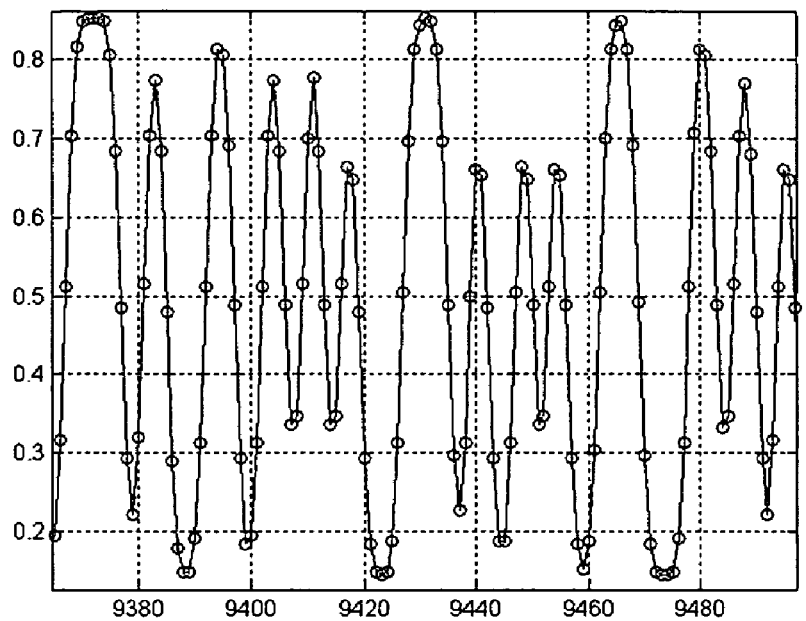
FIG. 1 shows a channel signal without asymmetry.
Figure 2:
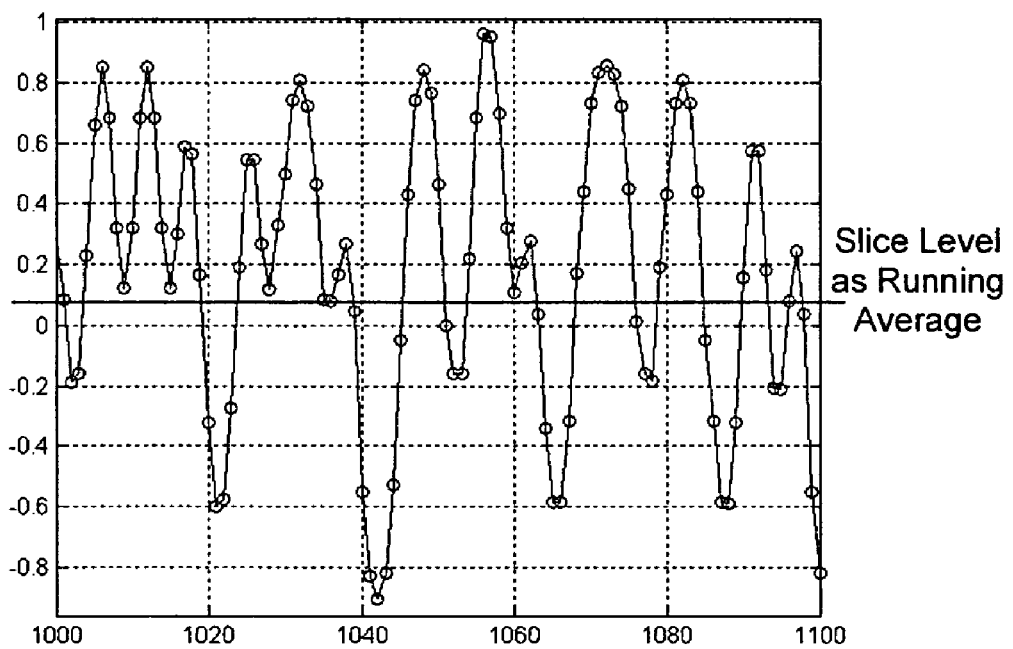
FIG. 2 shows a channel signal with asymmetry.
Figure 3:
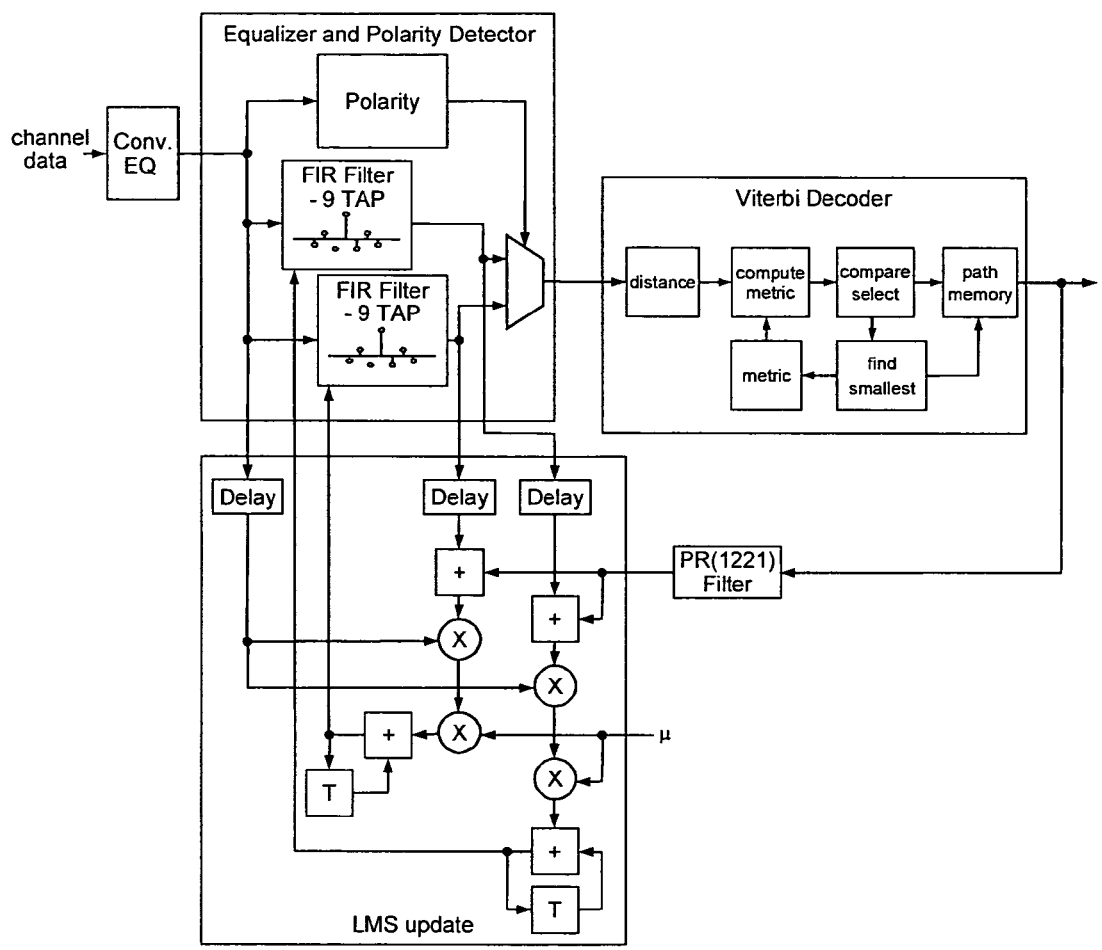
FIG. 3 shows an approach using an equalizer with a dual adaptive filter.
Figure 4:
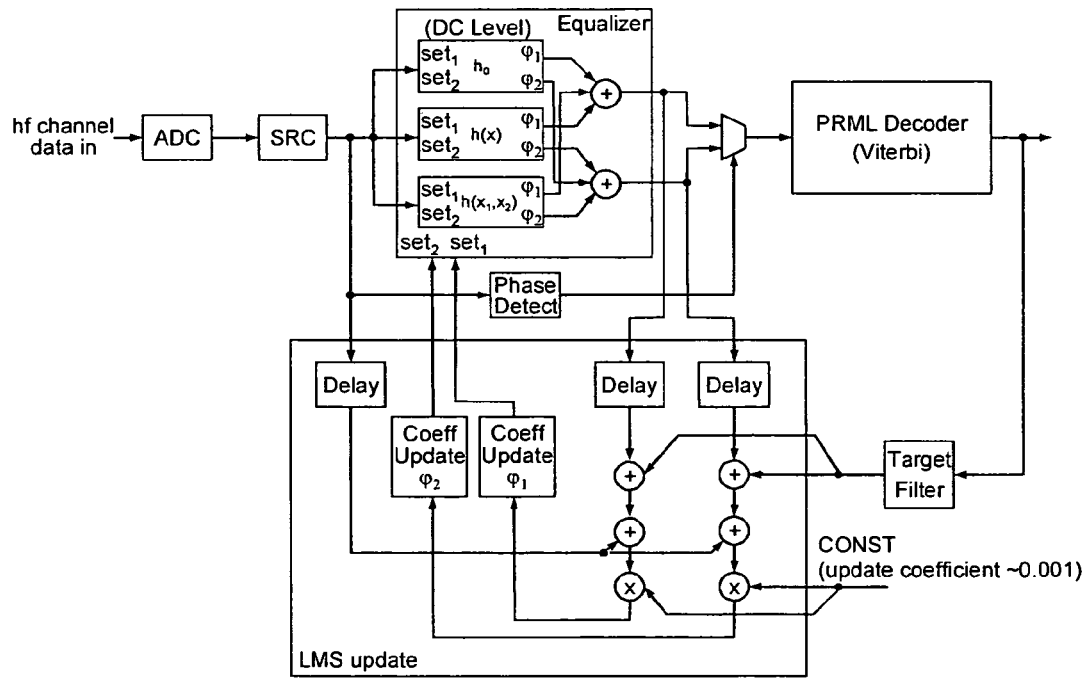
FIG. 4 shows a solution according to the invention using an equalizer with a single filter but two coefficient sets.

In FIG. 4 a solution according to the invention using an equalizer with a single filter but two coefficient sets is shown. Instead of an FIR filter a polynomial filter (Volterra Filter), which is simplified to an additional DC level and a multiplier to create a quadratic filter stage, is used. The algorithm representing the non-linear filter can be expressed with the following (simplified) equation 1:

$$y_k = h_0 + h_1(x(k)) + h_2(x(k),x(k)) \qquad (1)$$

The known approach using an FIR filter only considers the term $h_1(x(k))$. The polyphase term $h_2$, which is basically a quadrature of the incoming signal, requires an additional DC compensation, which is taken into account by the factor $h_0$.

Figure 5:
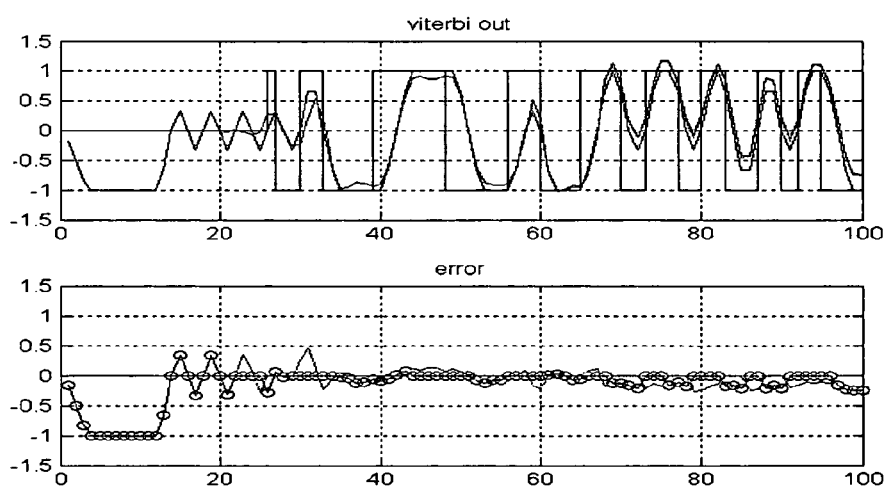
FIG. 5 shows the differences between signals generated by the dual equalizer and Viterbi decoded data.
Figure 6:
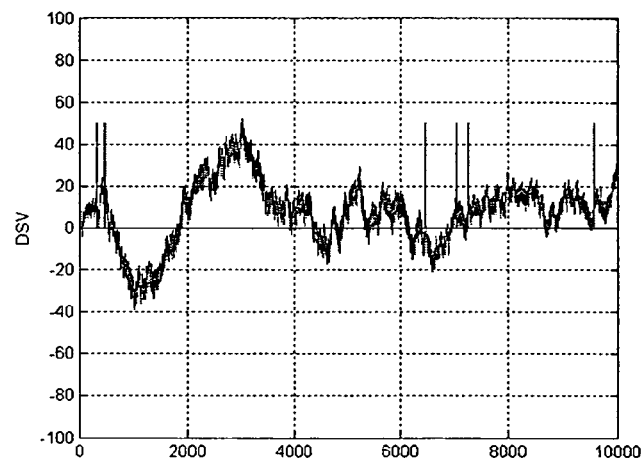
FIG. 6 shows the digital sum value (DSV) of the recovered data compared with the reference data.
Figure 7:
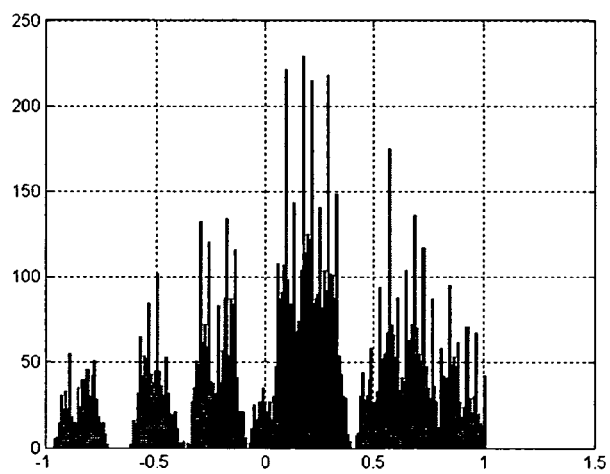
FIG. 7 shows a signal level distribution of the channel data.
Figure 8:
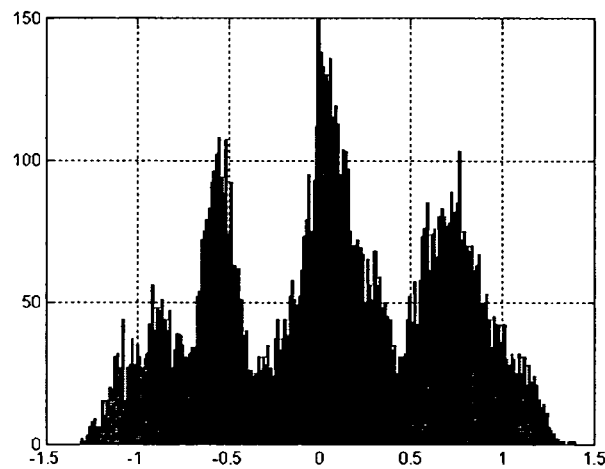
FIG. 8 shows the signal level distribution after equalization.

FIG. 5 to FIG. 8 show simulation results obtained with the solution according to the invention. In FIG. 5 the differences between signals generated by the dual equalizer and Viterbi decoded data. FIG. 6 compares the digital sum value (DSV) of the recovered data with the reference data. In the graph, errors in data recovery are indicated as vertical bars. In FIG. 7 a signal level distribution of the channel data is shown. For comparison FIG. 8 shows the signal level distribution after equalization.

What is claimed is:

1. A method for bit recovery in an asymmetric data channel comprising the steps of:
   providing a non-linear equalization filter with two coefficient sets;
   using the non-linear equalization filter with a first coefficient set for compensating defects of a first type of transition between different storage states; and
   using the non-linear equalization filter with a second coefficient set for compensating defects of a second type of transition between different storage states.

2. The method according to claim 1, characterized in that the non-linear equalization filter with two coefficient sets is implemented at least twice in parallel.

3. The method according to claim 1, characterized in that the non-linear equalization filter is a Volterra filter.

4. The method according to claim 3, characterized in that the Volterra filter includes a DC Compensator, a linear FIR and a quadratic term.

5. A device for bit recovery in an asymmetric data channel, the device comprising:
   a non-linear equalization filter with two coefficient sets,
   wherein the non-linear equalization filter is used with a first coefficient set for compensating defects of a first type of transition between different storage states and with a second coefficient set for compensating defects of a second type of transition between different storage states.

6. The device according to claim 5, characterized in that the non-linear equalization filter with two coefficient sets is implemented at least twice in parallel.

7. The device according to claim 5, characterized in that the non-linear equalization filter is a Volterra filter.

8. The device according to claim 7, characterized in that the Volterra filter includes a DC Compensator, a linear FR and a quadratic term.

9. The device of claim 5, wherein the device is a part of an apparatus for reading from and/or writing to recording media.

* * * * *